United States Patent
Kinoshita et al.

(10) Patent No.: US 11,379,002 B2
(45) Date of Patent: Jul. 5, 2022

(54) PORTABLE INFORMATION DEVICE AND DISPLAY ASSEMBLY

(71) Applicant: Lenovo (Singapore) Pte. Ltd., Singapore (SG)

(72) Inventors: Hiroaki Kinoshita, Kanagawa (JP); Takehito Yamauchi, Kanagawa (JP); Tatsuya Ushioda, Kanagawa (JP); Shigehiro Horiuchi, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 17/178,527

(22) Filed: Feb. 18, 2021

(65) Prior Publication Data

US 2022/0121239 A1  Apr. 21, 2022

(30) Foreign Application Priority Data

Oct. 20, 2020  (JP) .............................. JP2020-175777

(51) Int. Cl.
   *G06F 1/16* (2006.01)
   *H05K 5/02* (2006.01)

(52) U.S. Cl.
   CPC .......... *G06F 1/1618* (2013.01); *G06F 1/1652* (2013.01); *G06F 1/1679* (2013.01); *H05K 5/0221* (2013.01); *H05K 5/0226* (2013.01)

(58) Field of Classification Search
   CPC .... G06F 1/1652; G06F 1/1681; G06F 1/1618; G06F 1/1679; H05K 5/0221; H05K 5/0226
   See application file for complete search history.

(56) References Cited

U.S. PATENT DOCUMENTS

| | | | | |
|---|---|---|---|---|
| 8,842,425 B2* | 9/2014 | Ryu | ...................... | G06F 1/1652 361/679.21 |
| 9,342,106 B2* | 5/2016 | Nurmi | ................... | G06F 1/1656 |
| 9,710,033 B2* | 7/2017 | Yamazaki | ............ | G06F 1/1643 |
| 9,964,995 B1* | 5/2018 | Morrison | ............ | H01Q 1/2266 |
| 10,013,027 B2* | 7/2018 | Sun | ........................ | G06F 1/1652 |
| 10,082,839 B1* | 9/2018 | Turchin | ............... | H05K 5/0226 |
| 10,091,896 B2* | 10/2018 | Chu | ..................... | H05K 5/0226 |
| 10,133,303 B2* | 11/2018 | Park | ...................... | G06F 1/1616 |
| 10,185,355 B2* | 1/2019 | Watamura | ............ | G06F 1/1637 |
| 10,209,746 B2* | 2/2019 | Baek | ..................... | G06F 1/1641 |

(Continued)

FOREIGN PATENT DOCUMENTS

JP   6453413 B1   1/2019

*Primary Examiner* — Adrian S Wilson
(74) *Attorney, Agent, or Firm* — Osha Bergman Watanabe & Burton LLP

(57) ABSTRACT

A portable information device includes: a first chassis; a second chassis coupled to be rotatable relative to the first chassis; a first plate fixed to the first chassis; a second plate fixed to the second chassis to be adjacent to the first plate; a display having a bending region; a first locking piece protruding from the first plate beyond a first end face to be able to come into contact with and separate from the second plate; a second locking piece protruding from the second plate beyond a second end face to be able to come into contact with and separate from the first plate; and a protruding part provided to protrude from at least one of the first end face and the second end face toward the other to come into contact with the other in a flat plate form.

6 Claims, 8 Drawing Sheets

(56) References Cited

U.S. PATENT DOCUMENTS

| | | | |
|---|---|---|---|
| 10,228,722 B2 * | 3/2019 | Watamura | G06F 1/1626 |
| 10,234,899 B1 * | 3/2019 | Brocklesby | G06F 1/1681 |
| 10,274,996 B2 * | 4/2019 | Lin | E05D 3/06 |
| 10,545,537 B2 * | 1/2020 | Ahn | B32B 27/281 |
| 10,860,056 B2 * | 12/2020 | Watamura | G06F 1/1643 |
| 10,863,635 B2 * | 12/2020 | Watamura | H05K 5/0017 |
| 2017/0254127 A1 * | 9/2017 | Uchiyama | G06F 1/1616 |
| 2020/0249723 A1 * | 8/2020 | Mizoguchi | G06F 1/1626 |
| 2020/0275563 A1 * | 8/2020 | Watamura | G06F 1/1626 |
| 2021/0124397 A1 * | 4/2021 | Mizoguchi | G06F 1/1652 |
| 2021/0365066 A1 * | 11/2021 | Kinoshita | G06F 1/1679 |
| 2021/0365072 A1 * | 11/2021 | Kinoshita | G06F 1/1616 |
| 2022/0026960 A1 * | 1/2022 | Shibayama | G06F 1/1618 |

* cited by examiner

PORTABLE INFORMATION DEVICE AND DISPLAY ASSEMBLY

FIELD OF THE INVENTION

The present invention relates to a portable information device and a display assembly.

BACKGROUND

In recent years, a portable information device, such as a tablet PC or a smartphone having a touch panel type liquid crystal display and not having a physical keyboard, has rapidly spread. The display of this kind of portable information device has been desired to be large when in use but has been desired to be miniaturized when not in use.

Therefore, a portable information device using a flexible display such as organic EL (Electro Luminescence) to make not only a chassis but also the display foldable has been proposed (for example, see Japanese Patent No. 6,453,413).

It is preferred that the back surface of the flexible display be supported by a hard member when in use, in which the flexible display is opened in a flat plate shape. Therefore, in the structure of Japanese Patent No. 6,453,413 mentioned above, the display is pasted on the surfaces of a pair of right and left plates. In this structure, locking pieces, each of which protrudes between the right and left plates to come into contact with the other side, are provided to suppress the generation of a level difference between adjacent end faces of the plates.

In the meantime, the chassis of such a portable information device as mentioned above is highly required to be smaller and thinner. Therefore, it is difficult to provide each of the locking pieces over the entire length of each of the plate end faces due to the installation space restrictions inside the chassis, and the like. As a result, it is found that the end faces of the plates may be misaligned up and down and rub together in portions unsupported by the locking pieces to generate noise.

SUMMARY

One or more embodiments of the present invention provide a portable information device and a display assembly capable of suppressing the generation of noise between plates that support a display during rotational movement.

A portable information device according to the first aspect of the present invention includes: a first chassis; a second chassis provided adjacent to the first chassis and coupled to the first chassis to be rotatable relative to the first chassis between a flat plate form in which the first chassis and the second chassis are lined up with each other in a direction perpendicular to a surface normal direction, and a folded form in which the first chassis and the second chassis are disposed to overlap each other in the surface normal direction; a first plate fixed to the first chassis; a second plate fixed to the second chassis to be adjacent to the first plate and having a second end face to face a first end face of the first plate in the flat plate form; a display formed into one sheet shape and having a first region fixed to a surface of the first plate, a second region fixed to a surface of the second plate, and a bending region provided to straddle the first end face and the second end face between the first region and the second region; a first locking piece protruding from the first plate beyond the first end face to be able to come into contact with and separate from the second plate; a second locking piece protruding from the second plate beyond the second end face to be able to come into contact with and separate from the first plate; and a protruding part provided to protrude from at least one of the first end face and the second end face toward the other to come into contact with the other in the flat plate form, wherein in the flat plate form, the protruding part is located to overlap the first locking piece and the second locking piece in a thickness direction of the first plate and the second plate.

A display assembly according to the second aspect of the present invention includes: a first plate; a second plate provided adjacent to the first plate to be rotatable relative to the first plate between a flat plate form in which the first plate and the second plate are lined up with each other in a direction perpendicular to a surface normal direction, and a folded form in which the first plate and the second plate are disposed to overlap each other in the surface normal direction, and having a second end face to face a first end face of the first plate in the flat plate form; a display formed into one sheet shape and having a first region fixed to a surface of the first plate, a second region fixed to a surface of the second plate, and a bending region provided to straddle the first end face and the second end face between the first region and the second region; a first locking piece protruding from the first plate beyond the first end face to be able to come into contact with and separate from the second plate; a second locking piece protruding from the second plate beyond the second end face to be able to come into contact with and separate from the first plate; and a protruding part provided to protrude from at least one of the first end face and the second end face toward the other to come into contact with the other in the flat plate form, wherein in the flat plate form, the protruding part is located to overlap the first locking piece and the second locking piece in a thickness direction of the first plate and the second plate.

The above-described aspects of the present invention can suppress the generation of noise between plates that support a display during rotational movement.

DETAILED DESCRIPTION

A preferred embodiment of a display assembly and a portable information device according to the present invention will be described in detail below with reference to the accompanying drawings.

Figure 1:
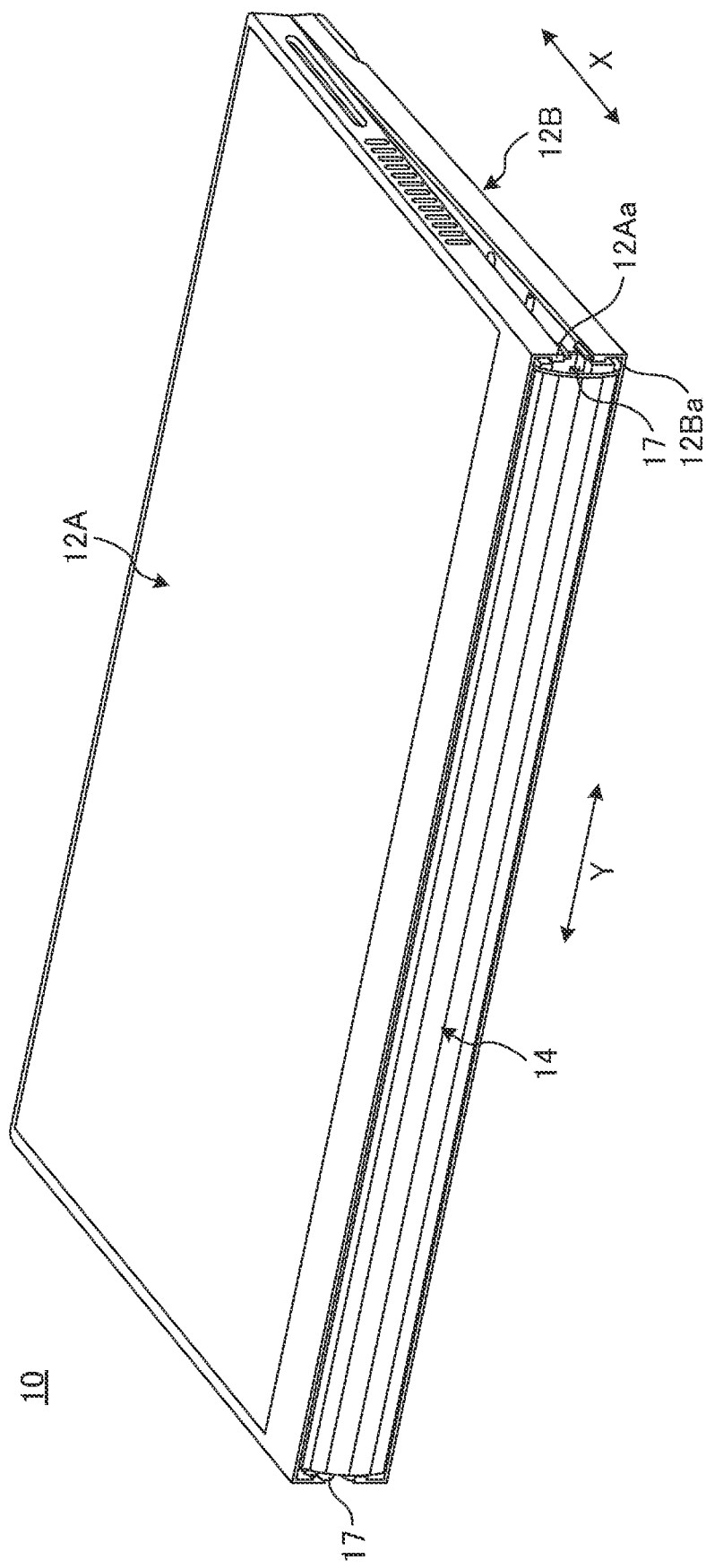
FIG. 1 is a perspective view illustrating a state where a portable information device according to one embodiment is closed and shaped into a folded form.
Figure 2:
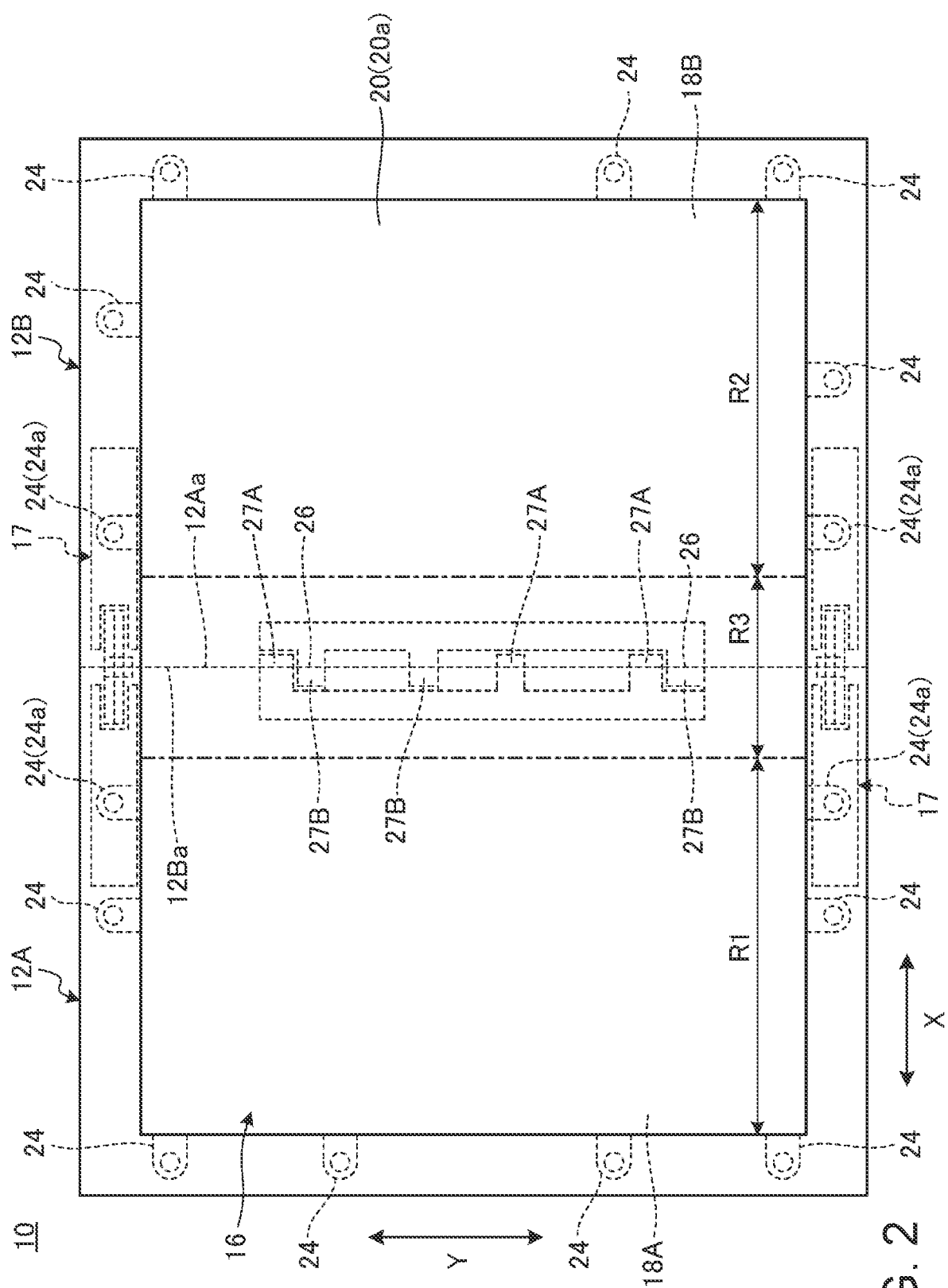
FIG. 2 is a plan view schematically illustrating a state where the portable information device illustrated in FIG. 1 is opened and shaped into a flat plate form.

FIG. 1 is a perspective view illustrating a state where a portable information device 10 according to one embodiment is closed and shaped into a folded form. FIG. 2 is a plan view schematically illustrating a state where the portable information device 10 illustrated in FIG. 1 is opened and shaped into a flat plate form.

As illustrated in FIG. 1 and FIG. 2, the portable information device 10 includes a first chassis 12A and a second chassis 12B, a spine member 14, and a display assembly 16. The portable information device 10 according to the present embodiment is a tablet PC foldable like a book. The portable information device 10 may be a cellular phone, a smartphone, a portable game machine, or the like.

The chassis 12A and 12B are disposed adjacent to each other. Each of the chassis 12A and 12B is formed into a rectangular plate-shaped member with side walls standing on three sides except the side (adjacent edge 12Aa, 12Ba) corresponding to the spine member 14, respectively. Each of the chassis 12A and 12B is formed from a metal plate made of stainless steel, magnesium, aluminum, or the like, or formed from a fiber-reinforced plastic plate containing reinforcing fiber such as carbon fiber. The spine member 14 is a member to hide a gap between adjacent edges 12Aa and 12Ba formed in the folded form illustrated in FIG. 1. The display assembly 16 extends across the chassis 12A and 12B.

As illustrated in FIG. 1 and FIG. 2, the portable information device 10 will be described below by expressing a line-up direction of the chassis 12A and 12B as an X direction and a direction orthogonal to the line-up direction along the adjacent edges 12Aa and 12Ba as a Y direction.

The adjacent edges 12Aa and 12Ba of the chassis 12A and 12B are coupled to each other through a pair of hinges 17, 17. The chassis 12A and 12B are coupled by the hinges to be rotatable relatively between the folded form illustrated in FIG. 1 and the flat plate form illustrated in FIG. 2. For example, the hinges 17 are arranged in both end portions of the adjacent edges 12Aa and 12Ba of the chassis 12A and 12B in the Y direction, and located outside of an outer peripheral edge of the display 16, respectively. The portable information device 10 of the present embodiment is so set that the bending center between the chassis 12A and 12B by the hinges 17 matches the bending center of a surface 20a of a display 20 (see FIG. 3).

On the inner surfaces of the respective chassis 12A and 12B, various electronic components such as a motherboard, various semiconductor chips like a CPU mounted on the motherboard, a communication module, a battery device, and a cooling device are mounted and fixed.

Figure 3:
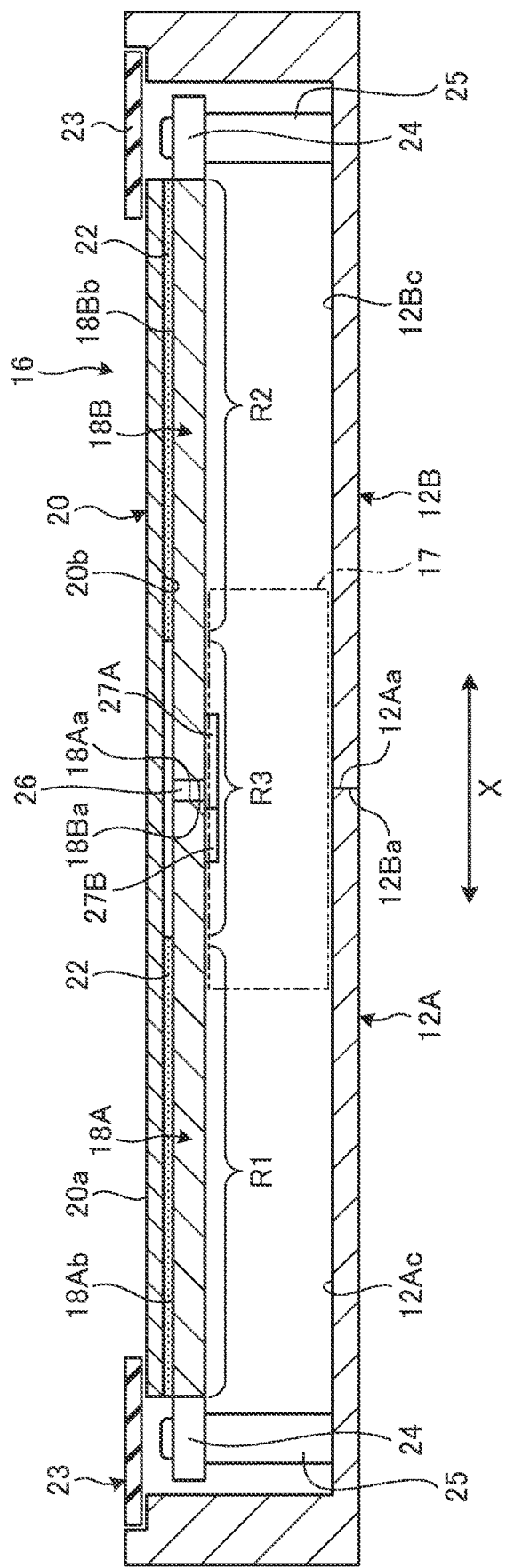
FIG. 3 is a side sectional view schematically illustrating the internal structure of the portable information device illustrated in FIG. 2.

FIG. 3 is a side sectional view schematically illustrating the internal structure of the portable information device 10 illustrated in FIG. 2. As illustrated in FIG. 3, the display assembly 16 includes a first plate 18A and a second plate 18B, and the display 20 supported by the plates 18A and 18B.

The first plate 18A and the second plate 18B support the display 20 on surfaces 18Ab and 18Bb thereof. The plates 18A and 18B are thin and hard plate-shaped members. A back surface 20b of the display 20 is pasted on the surfaces 18Ab and 18Bb of the plates 18A and 18B by using adhesive members 22. The plates 18A and 18B of the present embodiment are fiber-reinforced plastic plates containing carbon fiber or the like. The plates 18A and 18B may also be formed from metal plates made of stainless steel or the like. The first plate 18A is disposed to cover a top opening of the first chassis 12A. The second plate 18B is disposed to cover a top opening of the second chassis 12B.

As illustrated in FIG. 2 and FIG. 3, plural mounting pieces 24 are provided to protrude from outer end faces on three sides except end faces 18Aa and 18Ba of the plates 18A and 18B. Each of the mounting pieces 24 is screwed into a boss part 25 standing up from the inner surface of the chassis 12A, 12B (see FIG. 3). Thus, the plates 18A and 18B are fixed to the chassis 12A and 12B, respectively, and the display assembly 16 is fixed to the chassis 12A and 12B. The plates 18A and 18B may also be fixed to the chassis 12A and 12B by abutting and screwing up the back surfaces thereof into the boss parts 25 without using some or all of the mounting pieces 24.

In the flat plate form illustrated in FIG. 3, the plates 18A and 18B are lined up adjacent to each other in a direction (X direction) perpendicular to a surface normal direction, and the end faces 18Aa and 18Ba adjacent to each other face each other to form one flat plate shape. On this occasion, a bending region R3 of the display 20 is formed into a flat plate shape. In the folded form illustrated in FIG. 1, the plates 18A and 18B are disposed to overlap each other in the surface normal direction, and the end faces 18Aa and 18Ba are greatly separated from each other. On this occasion, the bending region R3 of the display 20 is curved in substantially U-shaped.

In the present embodiment, some mounting pieces 24 (mounting pieces indicated by reference numeral 24a in FIG. 2) close to the end faces 18Aa and 18Ba are fixed to the chassis 12A and 12B through the hinges 17. The mounting pieces 24a are supported in a floating state having slight rattling with respect to the hinges 17. Thus, even when a level difference is created between respective mounting pieces 24 due to manufacturing tolerance or assembly tolerance, this level difference is absorbed in floating portions of the plates 18A and 18B. As a result, the generation of the level difference between the end faces 18Aa and 18Ba of the plates 18A and 18B is suppressed, and hence a high flatness can be obtained in the flat plate form.

The display 20 is, for example, a touch panel type liquid crystal display. The display 20 is a flexible display such as an organic EL having a paper structure with high flexibility. As illustrated in FIG. 3, the display 20 is provided across the right and left plates 18A and 18B. The display 20 has an outer shape substantially identical to the outer shape of the plates 18A and 18B in the flat plate form. As illustrated in FIG. 2 and FIG. 3, the display 20 has a first region R1, a second region R2, and the bending region R3 as a third region.

The first region R1 is a section excluding the bending region R3 from a section in which the display 20 overlaps the first plate 18A. The first region R1 is fixed to the surface 18Ab of the first plate 18A using the adhesive member 22. The second region R2 is a section excluding the bending region R3 from a section in which the display 20 overlaps the second plate 18B. The second region R2 is fixed to the surface 18Bb of the second plate 18B using the adhesive member 22. The adhesive members 22 are, for example, double-sided tape or adhesive.

The bending region R3 is a section to be bent when the chassis 12A and 12B are changed from the flat plate form to the folded form. The bending region R3 is a narrow band-shaped region provided between the first region R1 and the second region R2, which is disposed to straddle the end faces 18Aa and 18Ba of the plates 18A and 18B. No adhesive member 22 is provided on the back surface 20b in the bending region R3. In other words, the bending region R3 is not fixed to the surfaces 18Ab and 18Bb of the plates 18A and 18B, which is in a state to be movable relative to the surfaces 18Ab and 18Bb.

Figure 4:
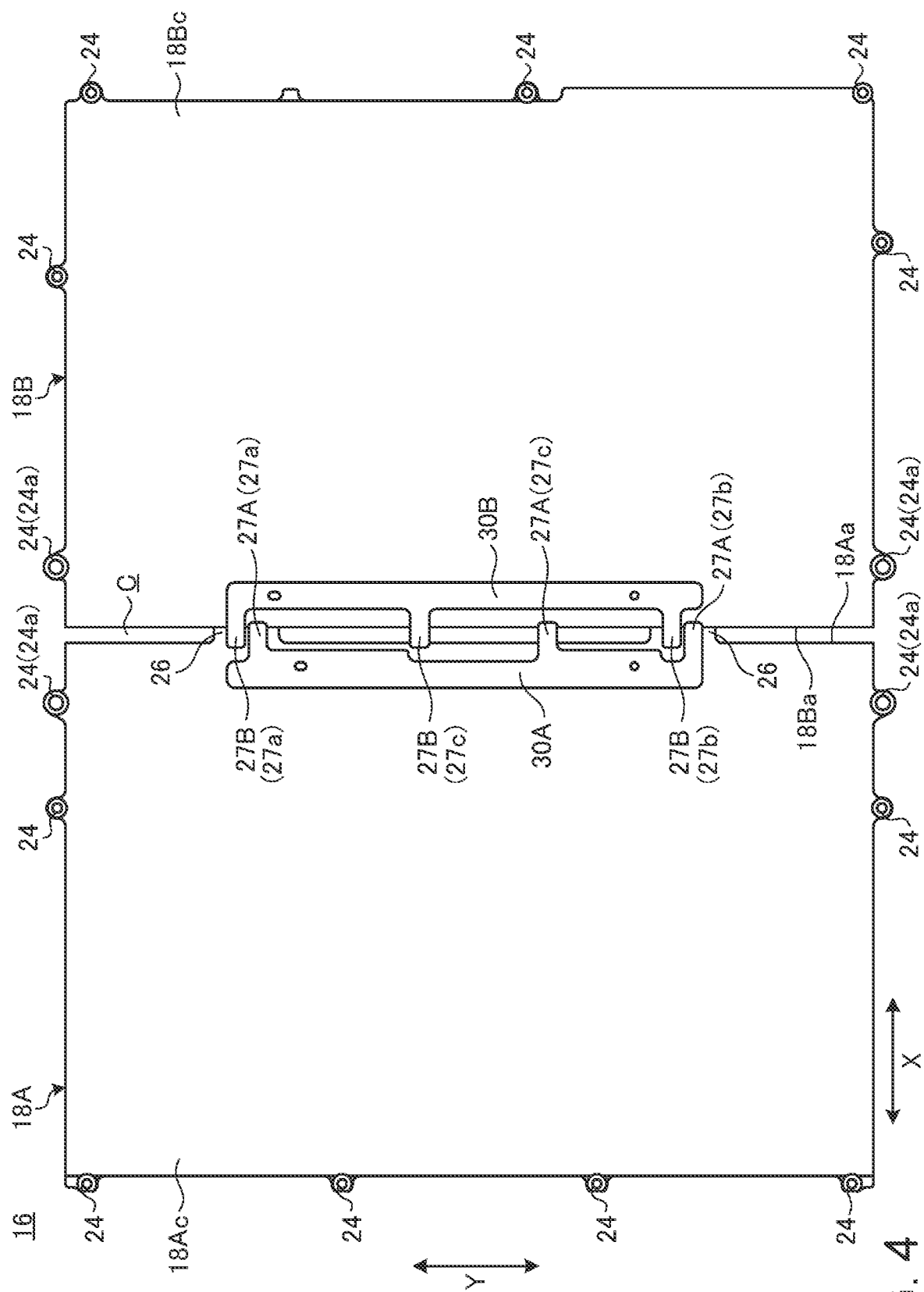
FIG. 4 is a plan view of right and left plates in the flat plate form as viewed from the side of back surfaces thereof.
Figure 5:
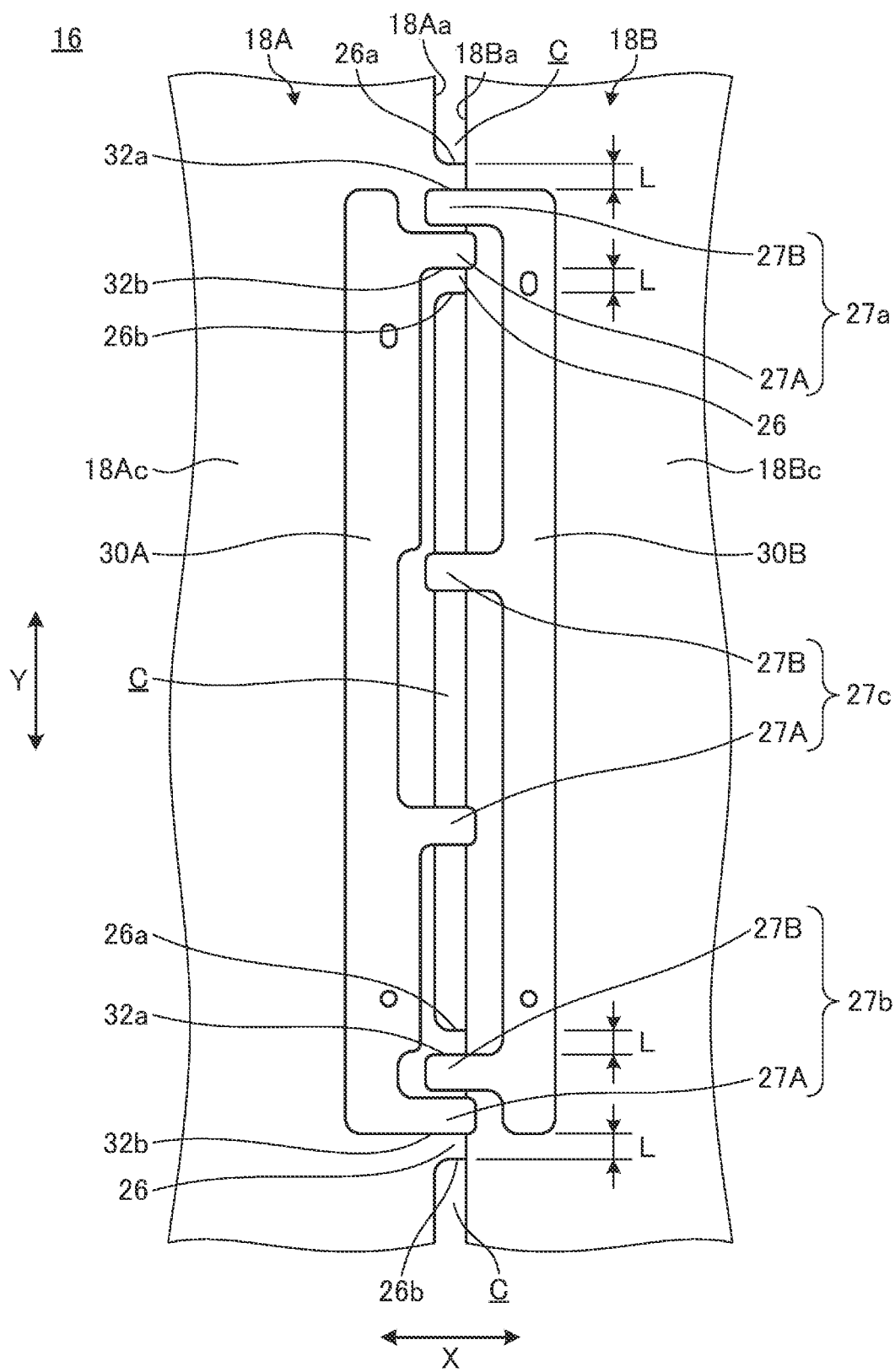
FIG. 5 is a plan view enlarging end faces of the plates illustrated in FIG. 4 and the vicinity thereof.

Next, a more detailed structure of the plates 18A and 18B will be described. FIG. 4 is a plan view of the right and left plates 18A and 18B in the flat plate form as viewed from the side of back surfaces 18Ac and 18Bc. FIG. 5 is a plan view enlarging the end faces 18Aa and 18Ba of the plates 18A and 18B illustrated in FIG. 4 and the vicinity thereof.

As illustrated in FIG. 3 to FIG. 5, a pair of protruding parts 26, 26 is provided on the end face 18Aa of the first plate 18A. Claw-shaped locking pieces 27A and 27B are provided alternately on each of the back surfaces 18Ac and 18Bc of the plates 18A and 18B, respectively. The structure and positional relationship of the protruding parts 26 and the locking pieces 27A, 27B will be described below based on the flat plate form illustrated in FIG. 4 and FIG. 5.

First, the protruding parts 26 will be described. As illustrated in FIG. 4 and FIG. 5, each of the protruding parts 26 protrudes from a portion of the end face 18Aa toward the end face 18Ba of the second plate 18B. The protruding part 26 is, for example, formed into a trapezoidal shape or a rectangular shape in plan view. The pair of protruding parts 26 is provided in a longitudinal direction (Y direction) of the end face 18Aa. The length of each of the end faces 18Aa and 18Ba of the plates 18A and 18B of the present embodiment in the Y direction is about 215 mm. On the other hand, the length of each of the protruding parts 26 in the Y direction is set to about 20 mm. The protrusion length of each of the protruding parts 26 (the length in the X direction) is, for example, 0.01 to 0.03 mm, which is extremely small. In FIG. 3 to FIG. 5, the protrusion length of the protruding part 26 are illustrated as exaggeratedly large, and the same applies to FIG. 6 and subsequent figures.

In the flat plate form, the distal end face of each of the protruding parts 26 abuts on the end face 18Ba. Each of the protruding parts 26 is in line or point contact with the end face 18Ba in plan view. In other words, the pair of protruding parts 26, 26 protruding from the end face 18Aa of the first plate 18A abuts on the end face 18Ba of the second plate 18B. Therefore, in the flat plate form, a gap C with a width (0.01 to 0.03 mm) corresponding to the protrusion length of the protruding parts 26 is formed between the end faces 18Aa and 18Ba. In other words, it is inevitable that a distortion or the like will be caused in the plates 18A and 18B at the time of manufacture (for example, during CNC machining). Therefore, there is a concern that, when the end faces 18Aa and 18Ba are brought into contact with each other in the entire length thereof, an uneven contact occurs to cause the plates 18A and 18B to be fixed to the display 20 in a tilted state. Therefore, in the present embodiment, the occurrence of the uneven contact is prevented by bring the end faces 18Aa and 18Ba into contact with each other in two places (two points) by the pair of protruding parts 26, 26. At the same time, since the length of each of the protruding parts 26 in the Y direction is set small, about 20 mm, the occurrence of uneven contact between the protruding parts 26 are suppressed by the protruding parts 26 themselves.

Next, the locking pieces 27A and 27B will be described. As illustrated in FIG. 3 to FIG. 5, each of the locking pieces 27A protrude from the back surface 18Ac of the first plate 18A up to a position to come into contact with the back surface 18Bc of the second plate 18B beyond the end faces 18Aa and 18Ba. For example, three locking pieces 27A are provided in the Y direction. Respective locking pieces 27A are plate pieces protruding in a comb-like shape from one band-shaped base plate 30A extending in the Y direction. Similarly, the locking pieces 27B protrude from the back surface 18Bc of the second plate 18B up to a position to come into contact with the back surface 18Ac of the first plate 18A beyond the end face 18Ba and 18Aa. Three locking pieces 27B are also provided in the Y direction, which are plate pieces protruding in a comb-like shape from a band-shaped base plate 30B.

In the flat plate form, a distal end part of the top surface of each of the locking pieces 27A and 27B comes into contact with the back surface 18Bc, 18Ac of the plate 18B, 18A on the other side to suppress the generation of a level difference between the plates 18A and 18B. In other words, one set of at least two locking pieces 27A and 27B mutually abut against the plates 18B, 18A on the other side to support each other in order to keep the plates 18A and 18B in the same plane, respectively.

In the present embodiment, three sets of locking pieces 27A and 27B are installed. In the following, an upper set of locking pieces 27A and 27B in FIG. 4 and FIG. 5 is called a first set 27a, a lower set is called a second set 27b, and an intermediate set is called a third set 27c. Each of the sets 27a to 27c is composed of one locking piece 27A and one locking piece 27B, respectively. The locking pieces 27A and 27B that constitute each of the first set 27a and the second set 27b are placed close to each other at a small distance of about 1 mm, for example. On the other hand, the locking pieces 27A and 27B that constitute the third set 27c are placed apart from each other at a large distance of about 30 mm, for example. Each of the sets 27a to 27c may be, for example, composed of two locking pieces 27A and 27B, respectively, or in a combination of two on one side and one on the other side. Although two sets of locking pieces 27A and 27B or four or more sets thereof may also be installed, it is preferred to have two or more sets close to each other in such a manner that the distance from each other is equal to or less than a predetermined distance (for example, 10 mm). This is to make the sets correspond to the pair of protruding parts 26, 26.

Figure 6:
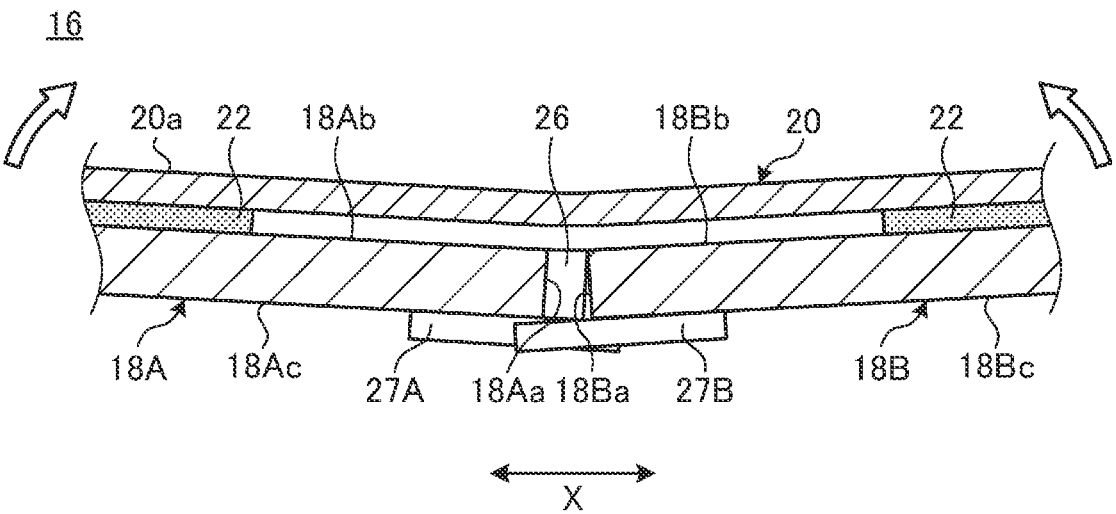
FIG. 6 is a schematic side sectional view enlarging the main part of a display assembly according to the present embodiment.

As apparent from FIG. 3 and FIG. 6, when changing from the flat plate form to the folded form, the distal part of the top surface of each of the locking pieces 27A and 27B moves in a direction away from the back surface 18Bc, 18Ac of the plate 18B, 18A on the other side. Therefore, the locking piece 27A, 27B does not disturb the rotational movement of the plates 18A and 18B.

Next, the relationship between the protruding parts 26 and the locking pieces 27A, 27B will be described. As illustrated in FIG. 5, each of the protruding parts 26 is placed in a position to overlap the locking pieces 27A and 27B in a thickness direction of the plates 18A and 18B in the flat plate form. Specifically, the upper-side protruding part 26 in FIG. 5 is placed across the first set 27a of locking pieces 27A and 27B in the Y direction. The lower-side protruding part 26 in FIG. 5 is placed across the second set 27b of locking pieces 27A and 27B in the Y direction.

Here, as for the first set 27a of locking pieces 27A and 27B, sides facing each other are called inner sides, and the sides on the other side are called outer sides 32a and 32b, respectively. In other words, the outer side 32a indicates the outer side of the locking piece 27A, and the outer side 32b indicates the outer side of the locking piece 27B.

Then, one edge 26a of the protruding part 26 corresponding to the first set 27a in the Y direction is located in a position not to be separated by a predetermined distance L (for example, 10 mm) or more from the outer side 32a. The other edge 26b of the protruding part 26 in the Y direction is located in a position not to be separated by the predetermined distance (for example, 10 mm) or more from the outer side 32b. Similarly, each of the edges 26a and 26b of the protruding part 26 corresponding to the second set 27b is located in a position not to be separated by the predetermined distance L (for example, 10 mm) or more from the outer side 32a, 32b of the locking piece 27A, 27B, respectively. Note that it is preferred that the total value of the lengths (widths) of the locking pieces 27A and 27B in the Y direction should be identical to or smaller than the length of the protruding part 26 in the Y direction. In the present embodiment, the width of each of the locking pieces 27A and 27B in the Y direction is set to be about 4.5 mm. Therefore, in the present embodiment, each distance L is set to be about 5 mm.

Figure 7:
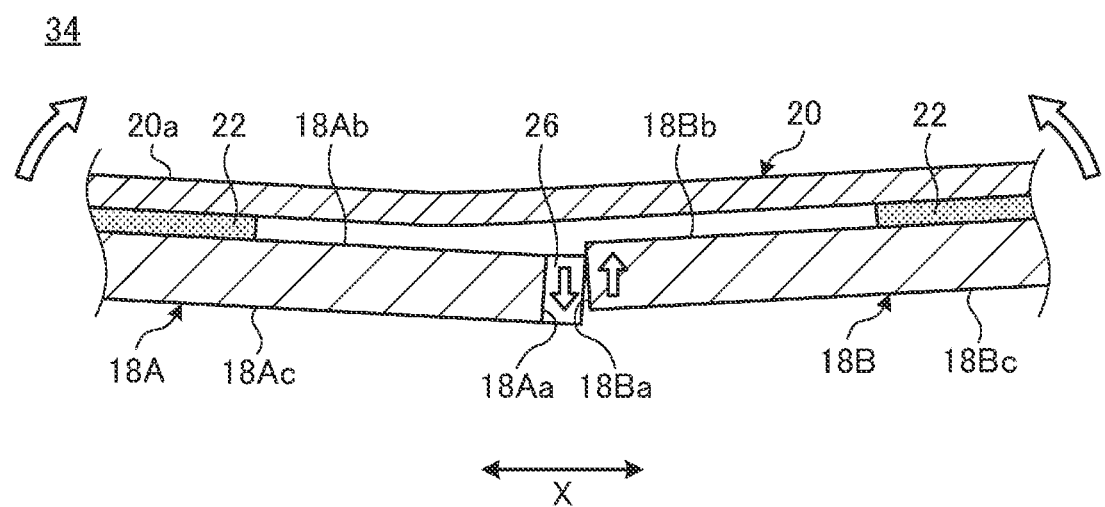
FIG. 7 is a schematic side sectional view enlarging part of a display assembly according to a comparative example.

FIG. 6 is a schematic side sectional view enlarging the main part of the display assembly 16 according to the present embodiment. FIG. 7 is a schematic side sectional view enlarging part of a display assembly 34 according to a comparative example. FIG. 6 illustrates a state immediately after the start of movement of the display assembly 16 of the present embodiment from the flat plate form to the folded form. FIG. 7 illustrates a state in the structure of the comparative example, that is, a structure that does not have the locking pieces 27A, 27B, or a structure having locking pieces 27A, 27B in positions not to overlap the protruding parts 26, immediately after the star of movement of the display assembly 34 from the flat plate form to the folded form.

As illustrated in FIG. 7, in the display assembly 34 of the comparative example, the plates 18A and 18B start rotating during this movement around a contact point between the protruding parts 26 and the end face 18Ba. On this occasion, the protruding parts 26 move while being pressed against the end face 18Ba on the other side. Therefore, the protruding parts 26 are misaligned up and down with the end face 18Ba immediately after the start of the rotational movement, and the end faces 18Aa and 18Ba may shift up and down with each other. As a result, the protruding parts 26 generate noise upon rubbing the end face 18Ba, causing a concern that the quality of the display assembly 34 and the portable information device 10 might be deteriorated.

On the other hand, as illustrated in FIG. 6, even in the display assembly 16 of the present embodiment, the plates 18A and 18B start rotating during this movement around the contact point between the protruding parts 26 and the end face 18Ba. Particularly, the display assembly 16 of the present embodiment has such a structure that the bending region R3 of the display 20 between the plates 18A and 18B in the X direction receives a tensile force in a widened direction in the flat plate form. This is to prevent the bending region R3 of the display 20 from generating wrinkles or swells in the flat plate form. Further, the mounting pieces 24a near the end faces 18Aa and 18Ba of the plates 18A and 18B are supported in a floating state with respect to the hinges 17. Therefore, during the movement from the flat plate form to the folded form, the plates 18A and 18B receive a compressive force from the display 20 in a direction in which the end faces 18Aa and 18Ba are pressed against each other, and this tends to cause the above discussed noise generation.

However, in the display assembly 16, the protruding parts 26 are located in positions to overlap the locking pieces 27A and 27B in the thickness direction. Therefore, the plates 18A and 18B are not misaligned by the locking pieces 27A and 27B, and the protruding parts 26 are not misaligned up and down with respect to the end face 18Ba. As a result, the distal end face of each of the protruding parts 26 is suppressed from rubbing the end face 18Ba on the other side and hence generating noise, thus suppressing the quality deterioration of the display assembly 16 and the portable information device 10.

As for the structure of the comparative example illustrated in FIG. 7, noise is generated in the structure that does not have the locking pieces 27A, 27B as a matter of course, and similar noise can be generated even in the structure having the locking pieces 27A, 27B in positions not to overlap the protruding parts 26. For example, consider such a structure that the protruding parts 26 are provided in positions out of the locking pieces 27A, 27B in FIG. 4 (for example, near both ends of the gap C in the Y direction). In this structure, since the misalignment between the plates 18A and 18B is suppressed by the locking pieces 27A and 27B, it seems that the noise mentioned above is not generated. However, the plates 18A and 18B are made extremely thin not to limit the reduction in thickness of the chassis 12A, 12B, which is 1 mm or less, for example. Therefore, during the rotational movement of the plates 18A and 18B, the plates 18A and 18B are warped in positions where the locking pieces 27A and 27B are not present, and as a result, the protruding parts 26 located in the positions may generate the noise mentioned above.

Therefore, in the present embodiment, the distance between the inner sides of the locking pieces 27A and 27B in the sets 27a and 27b corresponding to the protruding parts 26 is set to be a predetermined distance (for example, 10 mm) or less. Thus, since the plates 18A and 18B are not warped at all or warping is very small if any, the generation of the above-mentioned noise between the locking pieces 27A and 27B in the sets 27a and 27b that overlap the protruding parts 26 is suppressed.

Further, each of the protruding parts 26 of the present embodiment is such that the distance L overhanging from the locking piece 27A, 27B in each set 27a, 27b is set to be a predetermined distance (for example, 10 mm) or less. Thus, a portion of the edge 26a, 26b of the protruding part 26 overhanging from the outer side 32a, 32b of the locking piece 27A, 27B is extremely small. Therefore, since the plates 18A and 18B are not warped at all or warping is very small if any, the generation of the above-mentioned noise in this portion is suppressed. In the present embodiment, the distance L is set to be about 5 mm, and this suppresses the generation of noise more reliably. Although the distance L may be changed depending on the length of the protruding parts 26 or the end faces 18Aa and 18Ba in the Y direction, and the thickness of the plates 18A and 18B, it is preferred to set the distance L to be half (10 mm) or less of the length (20 mm) of the protruding parts 26 in the Y direction.

Figure 8:
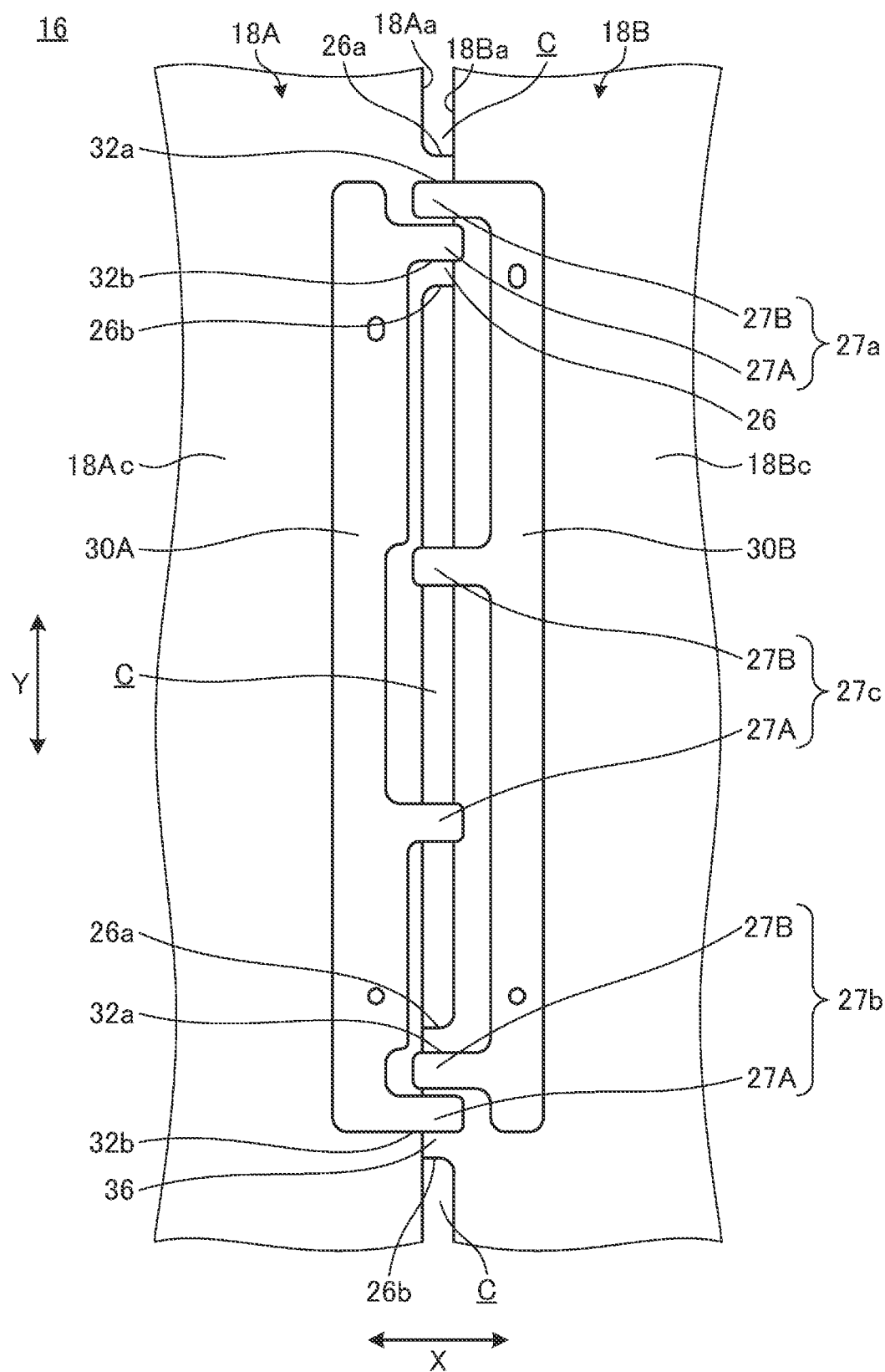
FIG. 8 is a plan view enlarging end faces of the plates including protruding parts according to a first modification and the vicinity thereof.
Figure 9:
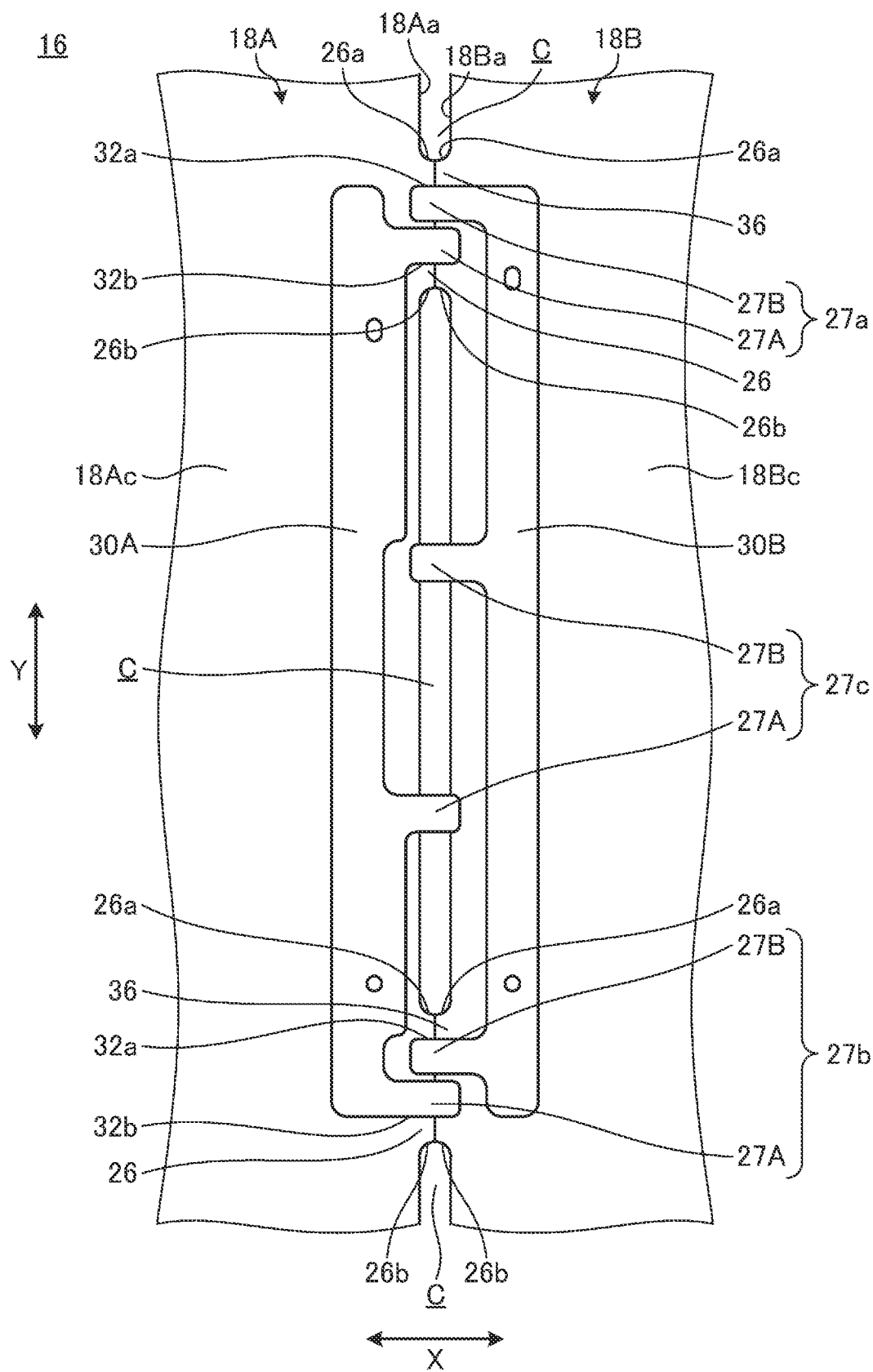
FIG. 9 is a plan view enlarging end faces of the plates including protruding parts according to a second modification and the vicinity thereof.

In the above, the structure in which each of the protruding parts 26 is provided on the end face 18Aa of the first plate 18A is illustrated. However, the protruding parts 26 may be provided on the side of the second plate 18B, or provided on both sides of the plates 18A and 18B. A first modification illustrated in FIG. 8 illustrates such a structure that a protruding part 36 protruding from the end face 18Ba of the second plate 18B toward the first plate 18A is provided instead of the protruding part 26 for the second set 27b. Note that the same reference numerals 26a and 26b as those of the protruding parts 26 are given to the outer sides of the protruding part 36. A second modification illustrated in FIG. 9 illustrates such a structure that protruding parts 26 and 36 protruding from the end faces 18Aa and 18Ba to face each other are so provided that both distal end faces are brought into contact with each other. In the structure example illustrated in FIG. 9, since the protrusion length of each of the protruding parts 26 and 36 is set to be half of the protrusion length in FIG. 5 and FIG. 8, the width of the gap C does not change.

Note that the present invention is not limited to the aforementioned embodiment, and changes can, of course, be made freely without departing from the scope of the present invention.

In the above, the portable information device 10 foldable in half like a book is illustrated. However, in addition to the structure in which the same shaped chassis are folded in half, the present invention can also be applied to various structures, such as a double-door structure in which two small-sized chassis are coupled to the right and left edges of a large-sized chassis in a foldable manner, an S-shaped folding structure in which two chassis different in folding direction from each other are coupled to the right and left edges of one chassis, and a J-shaped folding structure in which a small-sized chassis is coupled to one of the right and left edges of a large-sized chassis in a foldable manner, and the number of coupled chassis may be four or more.

DESCRIPTION OF SYMBOLS 10 portable information device
12A first chassis
12B second chassis
16, 34 display assembly
18A first plate
18B second plate
20 display
26, 36 protruding part
27A, 27B locking piece Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A portable information device comprising:
a first chassis;
a second chassis adjacent to the first chassis and that is coupled to the first chassis, wherein the second chassis is rotatable relative to the first chassis between:
a flat plate form in which the first chassis and the second chassis are lined up in a direction perpendicular to a surface normal direction, and
a folded form in which the first chassis and the second chassis are disposed to overlap each other in the surface normal direction;
a first plate fixed to the first chassis;
a second plate fixed to the second chassis to be adjacent to the first plate and having a second end face that faces a first end face of the first plate in the flat plate form;
a sheet-shape display having a first region fixed to a surface of the first plate, a second region fixed to a surface of the second plate, and a bending region that straddles the first end face and the second end face between the first region and the second region;
a first locking piece protruding from the first plate beyond the first end face to be able to come into contact with and separate from the second plate;
a second locking piece protruding from the second plate beyond the second end face to be able to come into contact with and separate from the first plate; and
a protruding part that protrudes from at least one of the first end face and the second end face toward the other one of the first end face and the second end face and that contacts the other one of the first end face and the second end face in the flat plate form, wherein
in the flat plate form, the protruding part overlaps the first locking piece and the second locking piece in a thickness direction of the first plate and the second plate.

2. The portable information device according to claim 1, wherein
a pair of protruding parts, each identical to the protruding part, is disposed in a longitudinal direction of the first end face and the second end face,
a plurality of first locking pieces, each identical to the first locking piece, and a plurality of second locking pieces, each identical to the second locking piece, are disposed, and a plurality of sets, each including the first locking piece and the second locking piece is disposed in the longitudinal direction, and
each of the pair of protruding parts is located to overlap any one of the sets, respectively.

3. The portable information device according to claim 2, wherein
three or more sets are provided as the plurality of sets to have at least two sets in each of which a distance between the first locking piece and the second locking piece is set to be a predetermined distance or less, and
each of the pair of protruding parts overlaps each set in which the distance is the predetermined distance or less.

4. The portable information device according to claim 2, wherein
each of the protruding parts straddles the first locking piece and the second locking piece that constitute each of the sets, and
edges of each of the protruding parts in the longitudinal direction are disposed without being separated by a predetermined distance or more from outer side faces of the first locking piece and the second locking piece, and
the outer side faces are opposite to inner side faces that face each other.

5. The portable information device according to claim 4, wherein
a length of each of the protruding parts in the longitudinal direction is a first distance,
a distance between each of the edges and each of the outer side faces is a second distance, and
the second distance is half or less than half of the first distance.

6. A display assembly comprising:
a first plate;
a second plate adjacent to the first plate and that is rotatable relative to the first plate between:
a flat plate form in which the first plate and the second plate are lined up in a direction perpendicular to a surface normal direction, and
a folded form in which the first plate and the second plate are disposed to overlap each other in the surface normal direction, wherein
the second plate includes a second end face that faces a first end face of the first plate in the flat plate form;
a sheet-shape display having a first region fixed to a surface of the first plate, a second region fixed to a surface of the second plate, and a bending region that straddles the first end face and the second end face between the first region and the second region;

a first locking piece protruding from the first plate beyond the first end face to be able to come into contact with and separate from the second plate;

a second locking piece protruding from the second plate beyond the second end face to be able to come into contact with and separate from the first plate; and a protruding part that protrudes from at least one of the first end face and the second end face toward the other one of the first end face and the second end face and that contacts the other one of the first end face and the second end face in the flat plate form, wherein in the flat plate form, the protruding part overlaps the first locking piece and the second locking piece in a thickness direction of the first plate and the second plate.

* * * * *